United States Patent
Ordentlich et al.

(10) Patent No.: US 8,917,537 B2
(45) Date of Patent: Dec. 23, 2014

(54) INLINE FUSES IN PROGRAMMABLE CROSSBAR ARRAYS

(71) Applicant: Hewlett-Packard Development Company, L.P., Houston, TX (US)

(72) Inventors: Erik Ordentlich, San Jose, CA (US); Ron M. Roth, Haifa, IL (US); Gadiel Seroussi, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 60 days.

(21) Appl. No.: 13/754,616

(22) Filed: Jan. 30, 2013

(65) Prior Publication Data

US 2014/0211536 A1   Jul. 31, 2014

(51) Int. Cl.
*G11C 11/00* (2006.01)
*G11C 13/00* (2006.01)
*G11C 17/16* (2006.01)

(52) U.S. Cl.
CPC .......... *G11C 13/004* (2013.01); *G11C 13/0069* (2013.01); *G11C 13/0007* (2013.01); *G11C 17/16* (2013.01); *G11C 2213/77* (2013.01)
USPC ..... 365/148; 365/225.7; 365/63; 365/185.21; 365/227

(58) Field of Classification Search
CPC .. G11C 17/165; G11C 7/1078; G11C 7/1084; G11C 5/025; G11C 11/16; G11C 17/16; G11C 2213/72; G11C 13/0028; G11C 13/003; G11C 13/0069; G11C 2213/78; G11C 8/08

USPC .............. 365/225.7, 148, 63, 96, 185.21, 227
See application file for complete search history.

(56) References Cited

U.S. PATENT DOCUMENTS

| | | | |
|---|---|---|---|
| 5,933,376 | A | 8/1999 | Lee |
| 6,670,824 | B2 | 12/2003 | Goodbread et al. |
| 2003/0207570 | A1* | 11/2003 | Perner et al. .................. 438/689 |
| 2011/0103132 | A1 | 5/2011 | Wei et al. |
| 2012/0170353 | A1 | 7/2012 | Iijima et al. |

FOREIGN PATENT DOCUMENTS

KR   20040009957   1/2004

OTHER PUBLICATIONS

Al-Ars, Z. et al., Static and Dynamic Behavior of Memory Cell Array Spot Defects in Embedded Drams, (Research Paper), Mar. 2003, IEEE Transactions on Computers, pp. 293-309, vol. 52, No. 3.

* cited by examiner

*Primary Examiner* — Thong Q Le
(74) *Attorney, Agent, or Firm* — Van Cott, Bagley, Cornwall & McCarthy; Steven L. Nichols

(57) ABSTRACT

A programmable crossbar array with inline fuses includes a layer of row lines and a layer of column lines with the row lines crossing over the column lines to form junctions and resistive memory elements sandwiched between row lines and a column lines at the junctions. Inline fuses are located in either the row lines, column lines or both. The inline fuses are interposed between the support circuitry and the resistive memory elements. A method for mitigating shorts in a crossbar array is also provided.

20 Claims, 7 Drawing Sheets

US 8,917,537 B2

INLINE FUSES IN PROGRAMMABLE CROSSBAR ARRAYS

BACKGROUND

Resistive memory elements are devices that can be programmed to different resistive states by applying programming energy. After programming, the state of the memristors can be read and remains stable over a specified time period. Large crossbar arrays of memristors can be used in a variety of applications, including non-volatile solid state memory, programmable logic, signal processing, control systems, pattern recognition, and other applications.

BRIEF DESCRIPTION OF THE DRAWINGS

The accompanying drawings illustrate various examples of the principles described herein and are a part of the specification. The illustrated examples are merely examples and do not limit the scope of the claims.

Throughout the drawings, identical reference numbers designate similar, but not necessarily identical, elements.

DETAILED DESCRIPTION

Crossbar arrays of resistive memory elements ("memristors") can be used in a variety of applications, including non-volatile solid state memory, programmable logic, signal processing, control systems, pattern recognition, and other applications. However, failures of the memristors can negatively impact the capacity and performance of the crossbar array. For example, if a memristor shorts, data may be lost and support circuitry damaged.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with the example is included in at least that one example, but not necessarily in other examples.

As used in the specification and appended claims, the term "resistive memory elements" refers broadly to programmable nonvolatile resistors such as resistive random access memory (ReRAM), phase change memory, and memristor technology based on perovskites (such as $Sr(Zr)TiO_3$), transition metal oxides (such as NiO or $TiO_2$), chalcogenides (such as $Ge_2Sb_2Te_5$ or AgInSbTe), solid-state electrolytes (such as GeS, GeSe, $Cu_2S$), organic charge transfer complexes (such as CuTCNQ), organic donor-acceptor systems, various molecular systems, or other nonvolatile programmable resistive memory elements.

Figure 1:
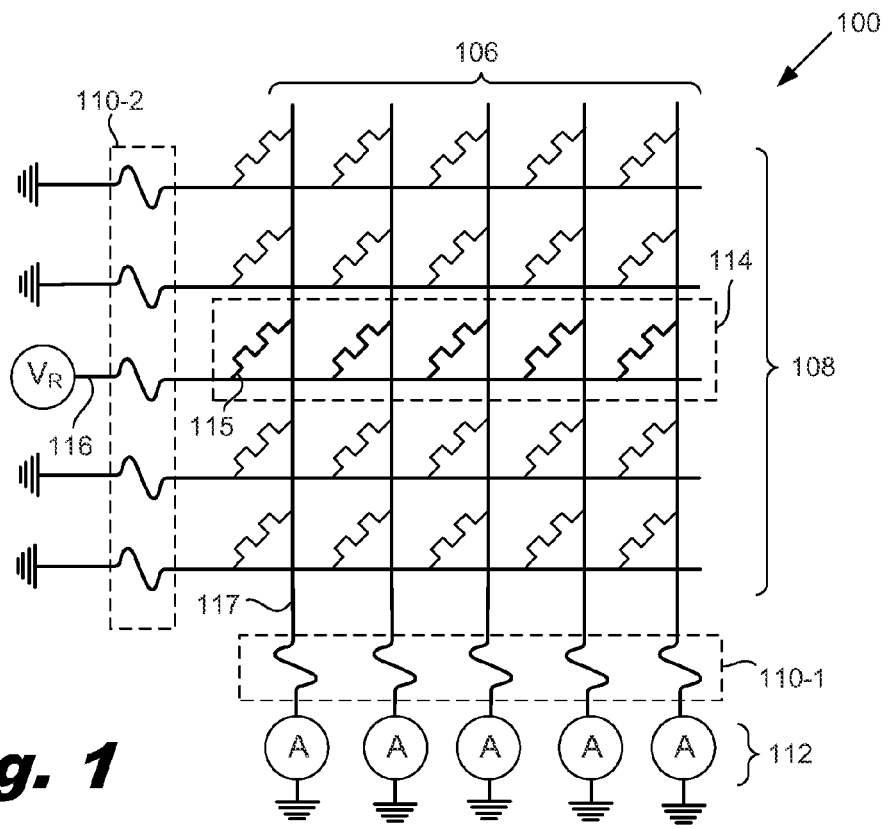
FIG. 1 is a diagram of a read operation of a programmable crossbar array that is populated with memristive or other resistive memory elements at each crossbar junction, according to one example of principles described herein.

FIG. 1 is a diagram of a programmable crossbar array (100). The crossbar array (100) includes a first group of conductive lines (106) called "column lines" and a second group of conductive lines (108) called "row lines." The column lines (106) cross the row lines (108) without actually intersecting each other. The crossings of the column and row lines are called "crossbar junctions." At the crossbar junctions, memristors or other resistive memory elements are formed between the column conductors and the row conductors. For example, memristor (115) has been formed between a column conductor (117) in the first group of lines and a selected row conductor (116) in the second group of lines. For purposes of description, only a small portion of the crossbar array (100) has been illustrated. The crossbar array may include many more conductors, crossbar junctions, and memory devices. In this example, the crossbar is shown as a parallel and perpendicular grid. However, the crossbar array may have a variety of other configurations.

The memristors or other resistive memory elements exhibit a non-volatile resistance value (a "state"). In some examples, the memristors can be used to store data, with the ON or low resistance state representing a digital 1 and an OFF or high resistance state representing a digital 0. In other implementations, the memristors may be multilevel cells that have more than two readable states.

The memristors are programmed by applying a programming voltage (or "write voltage") across a memristor. The application of the programming voltage causes a nonvolatile change in the electrical resistance of the memristor, thereby changing its state. The state of the memristor can be read by applying a read voltage. The read voltage has a lower magnitude than the write voltage and does not disturb the state of the memristor. The state can be determined by reading the amount of a current that passes through the memristor when the read voltage is applied. For example, if a relatively large amount of current flows through the memristor, it can be determined that the memristor is in a low resistance state. If a relatively small amount of current flows through the memristor, it can be determined that the memristor is in a high resistance state.

FIG. 1 shows the electrical configuration of a programmable crossbar array in a read configuration. A read voltage $V_R$ is applied to a row line (116), while the remainder of the row lines is connected to ground. The column lines (106) are also grounded. In this example, there are five memristors (114) connected to the selected row line (116) and the various column lines (106). These five memristors have the read voltage $V_R$ applied across them. Current sensors (112) are placed in each of the column lines to measure the amount of current that passes through each of the selected memristors (114). If a particular memristor is in a high resistance state, the current sensor in the column connected to the memristor will measure a low current. If the memristor is in a low resistance state, a higher current will be measured.

In this example, fuses (110-1, 110-2) are placed in each of the lines. In theft unblown state, the fuses have a relatively low electrical resistance and do not interfere with the measurement or programming of the memristors in the array. However, if there is a need to isolate a particular line, the fuse can be blown to disconnect the line from the support circuitry. As shown in FIG. 1, the support circuitry includes voltage sources, current sensors (112), and a ground. The desired support circuitry may be connected with the appropriate line by switches connected to each line in the memristor array.

Figure 2:
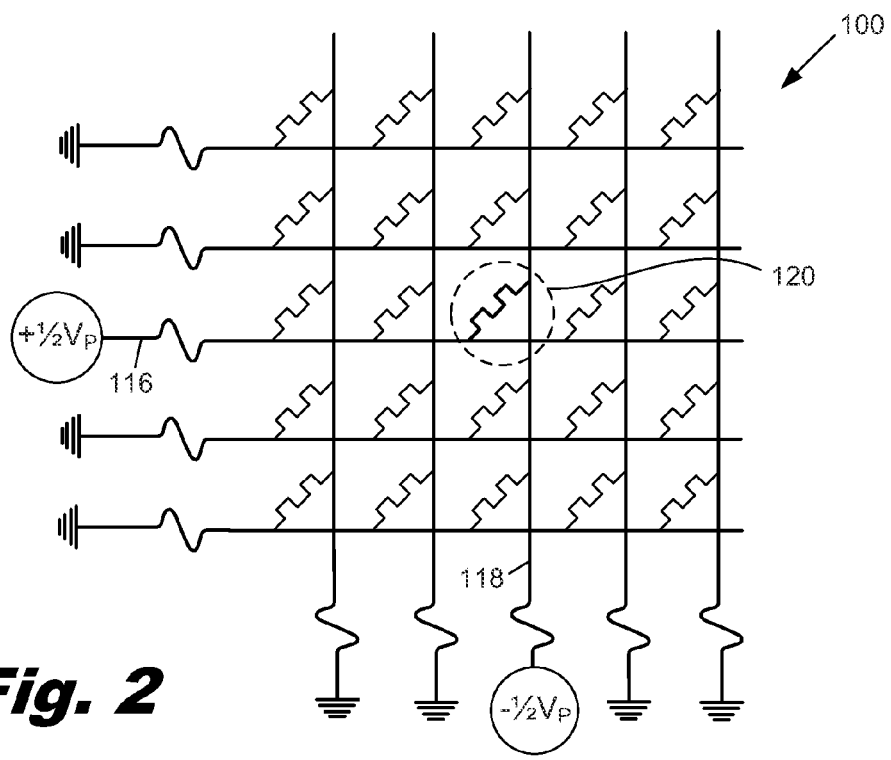
FIG. 2 is a diagram of a write operation within a programmable crossbar array, according to one example of principles described herein.

FIG. 2 shows the same programmable crossbar array (100) in a programming configuration. In this example, a target memristor (120) is being programmed. To program the target memristor, a programming voltage ($V_P$) is applied across the target memristor. In this example, half of the programming voltage ($+\frac{1}{2}V_P$) is applied to the row line (116) connected to the target memristor (120). The other half of the programming voltage ($\frac{1}{2}V_P$) is applied to the column line (118) that is connected to the opposite side of the target memristor. The application of the programming voltage across the target memristor (120) causes a change in the physical properties of the memristor. This alters the resistance state of the memristor. The change in physical properties could result in a higher electrical resistance or a lower electrical resistance, depending on the polarity and/or duration of the applied programming voltage.

The memristor at the intersection between the selected row (116) and column (118) conductors is the selected resistive device (120), while other resistive devices that are connected to only one of the selected row (116) or column (118) crossbars are called "half-selected" devices. The selected device (120) experiences the sum of the two voltages ($V_P$) while the half selected devices experience only half of the programming voltage, which is insufficient to significantly alter their state.

However, the half-selected devices can create "sneak paths" through which current can flow from the selected row conductor (116) to the selected column conductor (118) without passing through the selected device. These sneak currents are not desirable and act as noise that obscures the measurement of the state of the selected device (115). For writing, the sneak paths mean more current needs to be applied to the system, requiring larger transistors to handle the current and larger drivers to provide the current. These larger driving circuits increase the size of the total memory array and architecture, increasing the cost per bit.

Notice that while the programming configuration allows for writing into just one device, in the reading configuration it is possible to read a whole row since current measurements are available simultaneously for all columns. This can result in a significant speed increase during the reading process. For example, a programmable crossbar array may include hundreds or thousands of column lines that can be used simultaneously during a read operation.

Figure 3:
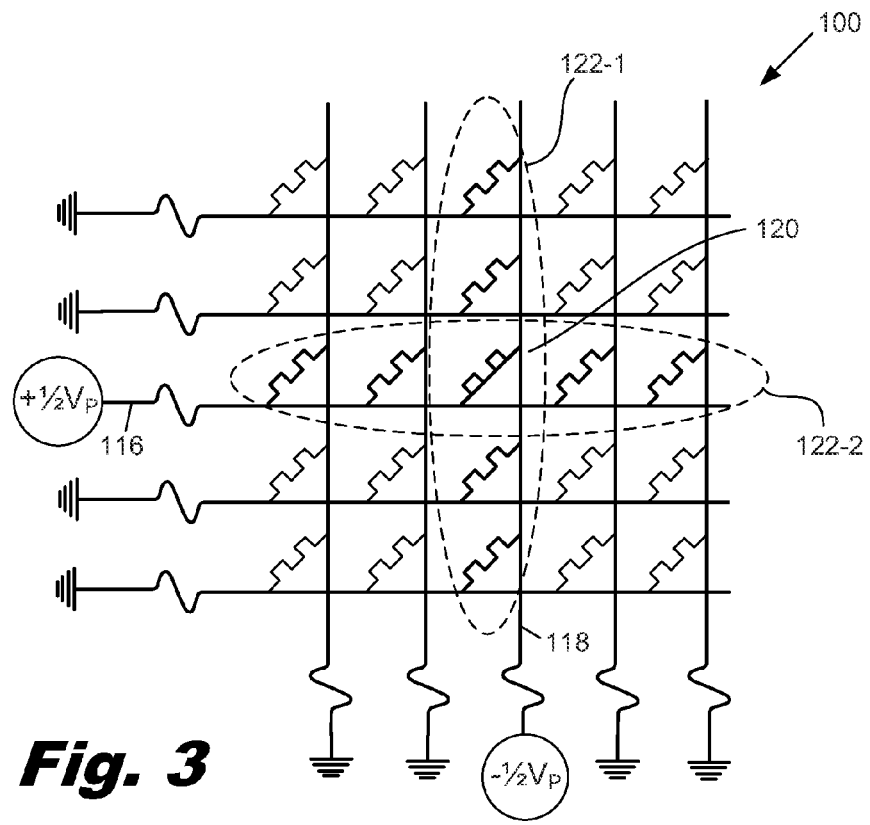
FIG. 3 is a diagram of a programmable crossbar array with a shorted memristor, according to one example of principles described herein.

FIG. 3 shows a programmable crossbar array (100) with a shorted memristor (120). A memristor may short for a variety of reasons, including wear, current spikes, defective manufacturing and other reasons. For example, a memristor that is being programmed from a high resistance state to a low resistance state may experience a surge in current as it transitions from high resistance to low resistance. The electrical characteristics of a shorted memristor are permanently altered so that it remains in a very low resistance state. This shorted state typically has a resistance that is substantially lower than the low resistance ON state of a working memristor. For example, the low resistance state of a working memristor may be on the order of 1 kilo-ohm to 1 mega-ohm. A shorted memristor may have an electrical resistance that is several orders of magnitude lower than this. For example, the shorted memristor may have an electrical resistance that is on the order of 0 ohms to 100 ohms. A shorted memristor cannot be programmed to any other higher resistance state. For example, a shorted memristor may have experienced heating that destroys its memristive matrix and melts the two conductive terminals of the memristor together.

A shorted memristor can degrade the performance of other memristors that share a row or column line with the shorted memristor. In FIG. 3 these "affected" memristors (122-1, 122-2) are circled with dashed lines. When a programming or read voltage is placed on the row and/or column of the shorted memristor, a significant amount of current may flow through the shorted memristor. This creates a leakage path for current and masks the state of the affected memristors. In some situations, it may be possible to read the state of the affected memristors but the affected memristors cannot be reliably written to. If the data can be retrieved from the affected memristors, it can be written to another location in the array or to a different memory.

Further, the presence of a shorted memristor may place significant burdens on support circuitry that is used to supply voltages/currents and measure the currents. For example, a shorted memristor may draw significantly more current from a circuit supplying a read voltage than the circuit is designed to produce. This may damage the circuit and render the entire programmable crossbar array inoperative. Additionally, the current sensing circuit connected to that column may be damaged. Further, the attempts to identify the shorted row/column during reading or writing operations may be unreliable since the short may still exhibit a range of resistance values.

Figure 4:
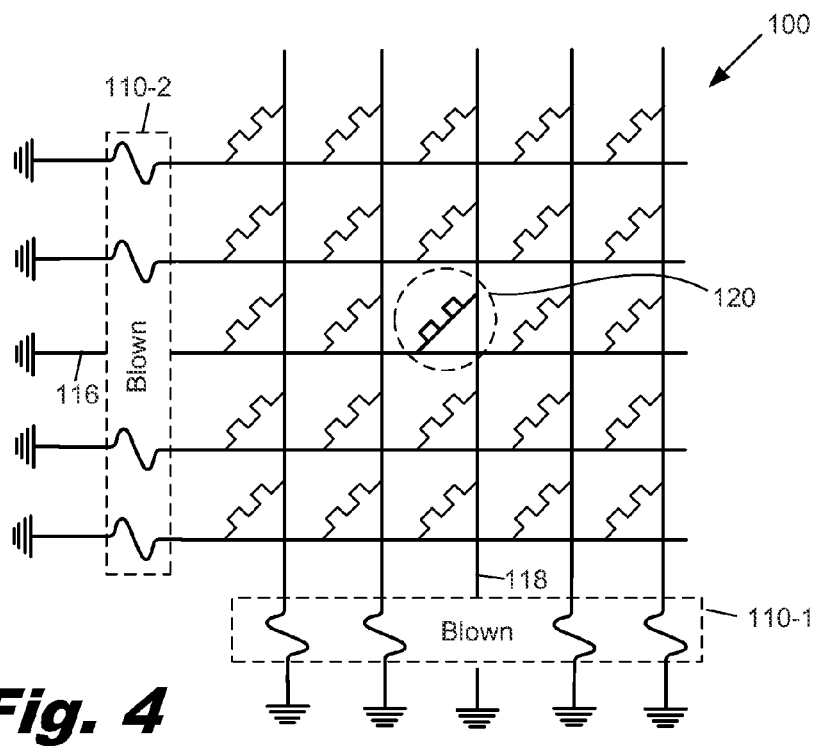
FIG. 4 is a diagram of a programmable crossbar array with blown fuses on the row and column of a shorted memristor, according to one example of principles described herein.

Consequently, it is desirable for there to be a mechanism for isolating the shorted memristor from the support circuitry and to mark the shorted memristor as defective. FIG. 4 shows an example where the inline fuses in the row and column lines connected to the shorted memristor have been blown. The blown fuses disconnect the row and column from the support circuitry and allow the remainder of the circuit to operate as designed. This prevents damage to the support circuitry while maintaining the operation of the remainder of the memristors.

The fuses may be formed in a variety of ways and from a variety of materials. In some examples, the fuses may simply be portions of the column and row lines that have a reduced cross section. These reduced cross section portions of the lines are designed to heat above their melting point when a current indicative of a shorted memristor passes through them. The reduced cross section portions may be designed to melt at current levels that will not damage the support circuitry. In some implementations, the column and row lines may be formed from a conductive metal such as gold, platinum, aluminum, copper or other suitable material.

Other examples of fuses may include separate materials that are interposed between supply circuits and the column/row lines. For example, a polysilicon fuse may be used. A polysilicon fuse is a narrow wire of polysilicon with a non-negligible electrical resistance in its unblown state. For example, a polysilicon fuse with a 0.18 micron width may have a nominal resistance of 20 to 30 ohms When polysilicon fuse is blown it can exhibit an electrical resistance that is 6 to 8 orders of magnitude higher. The principles disclosed herein are not limited to the specific examples described above. The fuse may be any device or mechanism that can disconnect the support circuitry from the row/column lines in response to the shorting of a memristor.

In examples where the fuses are purely resistive in nature, the shorting of the memristor may provide the current needed to blow the appropriate fuse. However, where there are fuses on both the row line and column line that are connected to the memristor, the shorting of the memristor will likely only blow one of the fuses. After the first fuse blows, the current stops and the second fuse will remain intact. In some implementations, this may be sufficient and fuses may only be implemented in row lines or column lines but not both (see e.g. FIGS. 8 and 9 and accompanying descriptions for examples). In other instances it may be desirable to have fuses in both the row and column lines and for both a row fuse and a column fuse to blow when a memristor shorts. As discussed below, this can be accomplished by using external circuitry/mechanisms to identify the second fuse and blow it.

The blowing of the fuses may serve a number of purposes including protection of the support circuitry and more effective recovery on the data in the shorted and/or affected memristors. For example, error correction coding (ECC) schemes are more effective (i.e. require less redundancy) if the presence of the short and the corresponding row/column pair are identified. These identified rows and columns are marked, for purposes of error correction, as "erased." Practical memory systems built of memristor devices are expected to include a very large number of crossbar arrays which could run into the millions or billions. Conceptually, the system could keep a "defect list" of shorted memristors and their locations (row and column). In practice however, the over head of maintaining and storing such a list may be considered excessive for some applications. Instead, the blown fuses may serve as physical markers of the rows and columns that contain shorted memristors.

After the fuse or fuses are blown the support circuitry is disconnected from the shorted memristor as shown in FIG. 4. As discussed above, this protects the support circuitry, marks the location of the shorted memristor, provides for more reliable reading operations, and allows for more efficient data recovery. However, the disconnected row and column lines may then float in a range of intermediate voltages. For example, the intermediate voltage may be influenced by programming and reading voltages that leak into the disconnected lines. These floating voltages on the disconnected lines may negatively influence the read and write operations for the remainder of the array and introduce variability into the behavior of the array.

Figure 5:
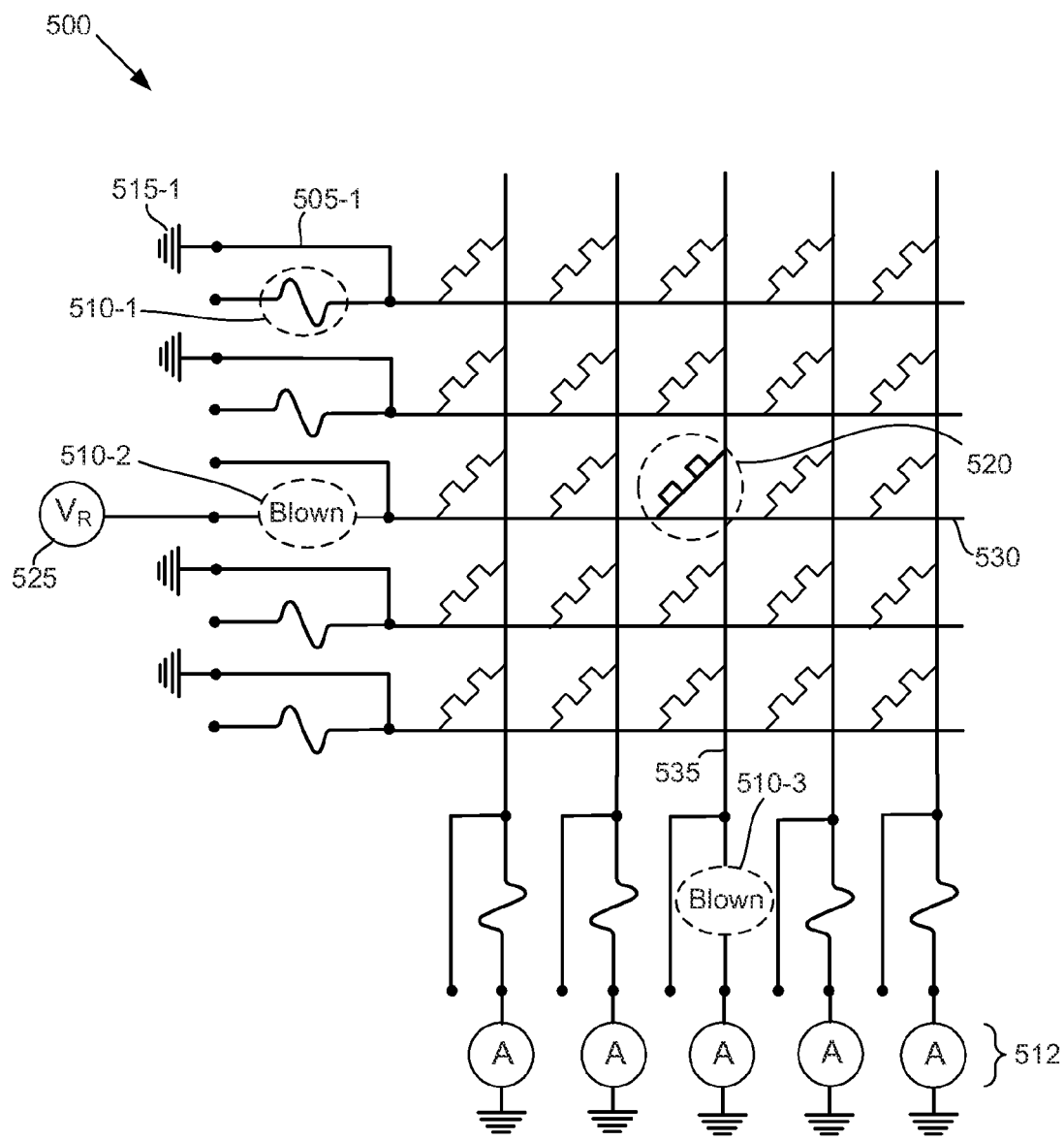
FIG. 5 is a diagram of a programmable crossbar array with blown fuses on the row and column of a shorted memristor with a read voltage applied to the row of the shorted memristor, according to one example of principles described herein.

FIG. 5 shows one example of a programmable crossbar array (500) that includes additional connection lines (505-1) that are connected to the row and column lines (530, 535) on the array side of the fuses (510). The support circuitry (515-1, 512, 525), is connected to the external side of the fuses. In FIG. 5, the array is in its read configuration with a read voltage (525) applied to a row line (530) with a blown fuse (510-2) and a shorted memristor (520). All other row lines are grounded via the additional lines.

The column lines (535) are configured with current sensors (512) to read currents that are passed through the various memristors. The fuse (510-3) in the central column line (535) is blown, disconnecting the current sensor from the line. The blown fuse (510-2) in the row line (530) prevents the read voltage (525) from being applied and consequently there is no current that passes through the memristors to the current sensors (512). Thus, in this implementation, the memristors in the row containing the shorted memristor (520) cannot be read. However, memristors that are in a different row and column than the shorted memristor can be programmed and read as shown below.

Figure 6:
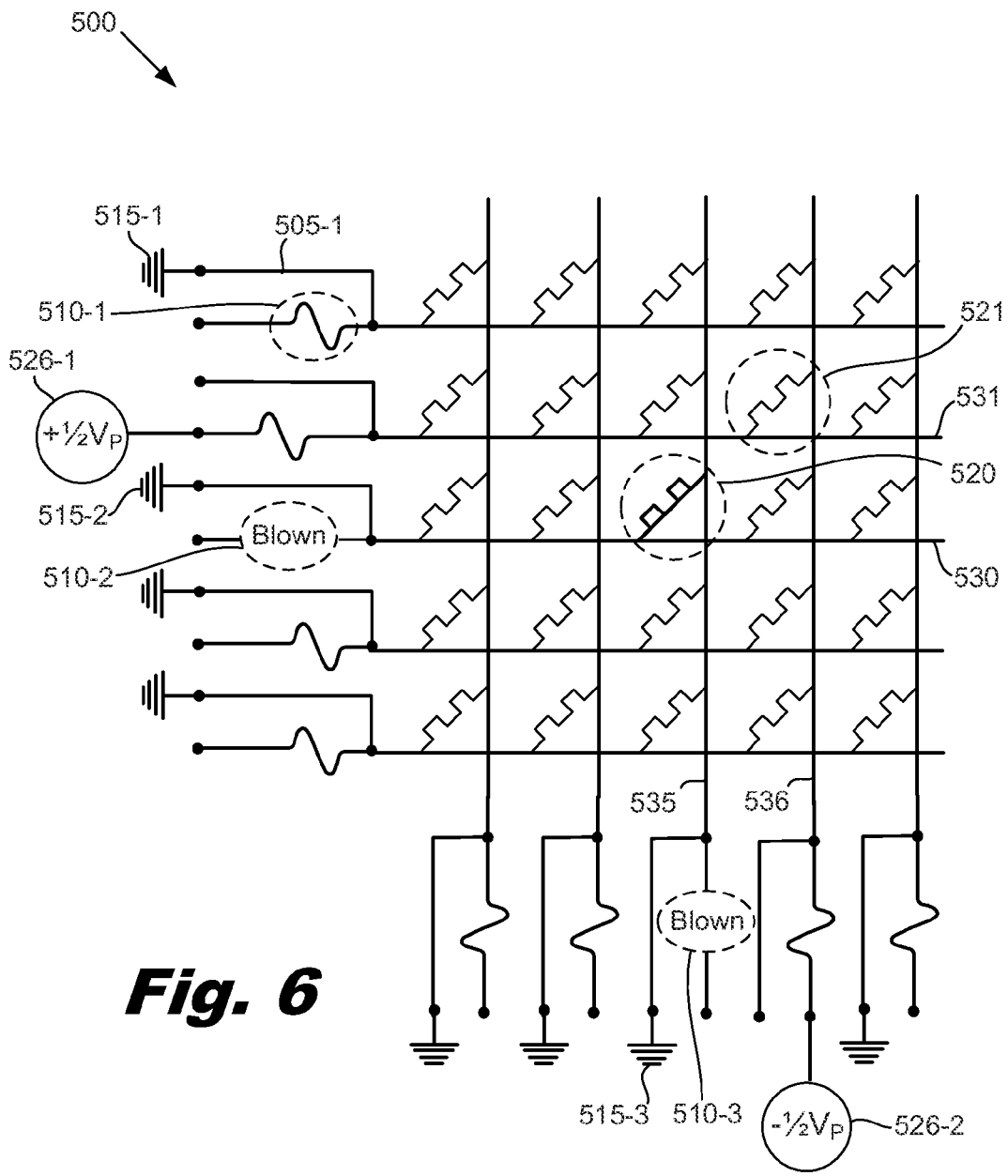
FIG. 6 is a diagram of a programmable crossbar array with programming voltages applied, according to one example of principles described herein.

FIG. 6 shows the programmable crossbar array (500) in a programming configuration with a programming voltage (526-1, 526-2) applied to a target memristor (521). The programming of memristors in the array could be performed in any of a variety of ways. In this example, half of the programming voltage ($+\frac{1}{2}V_P$) is applied to the row line (531) connected to the target memristor (521) and half of the programming voltage ($\frac{1}{2}V_P$) is applied to the column line (536) connected to the target memristor (521). This creates the full programming voltage ($V_P$) across the target memristor (521) and changes its state. This programming technique is only one example. A variety of other approaches could be used, including applying intermediate voltages to the unselected lines to reduce leakage currents through unselected memristors.

In this example, all of the unselected row and column lines are connected to ground (515) through the additional connection lines (505-1), including those row (530) and column lines (535) that have blown fuses (510-2, 510-3). Because the additional connection lines (505) connect to the row and column lines on the array side of the fuses, they allow column and row lines with blown fuses to be grounded. This prevents these lines from floating to other voltage levels.

Figure 7A:
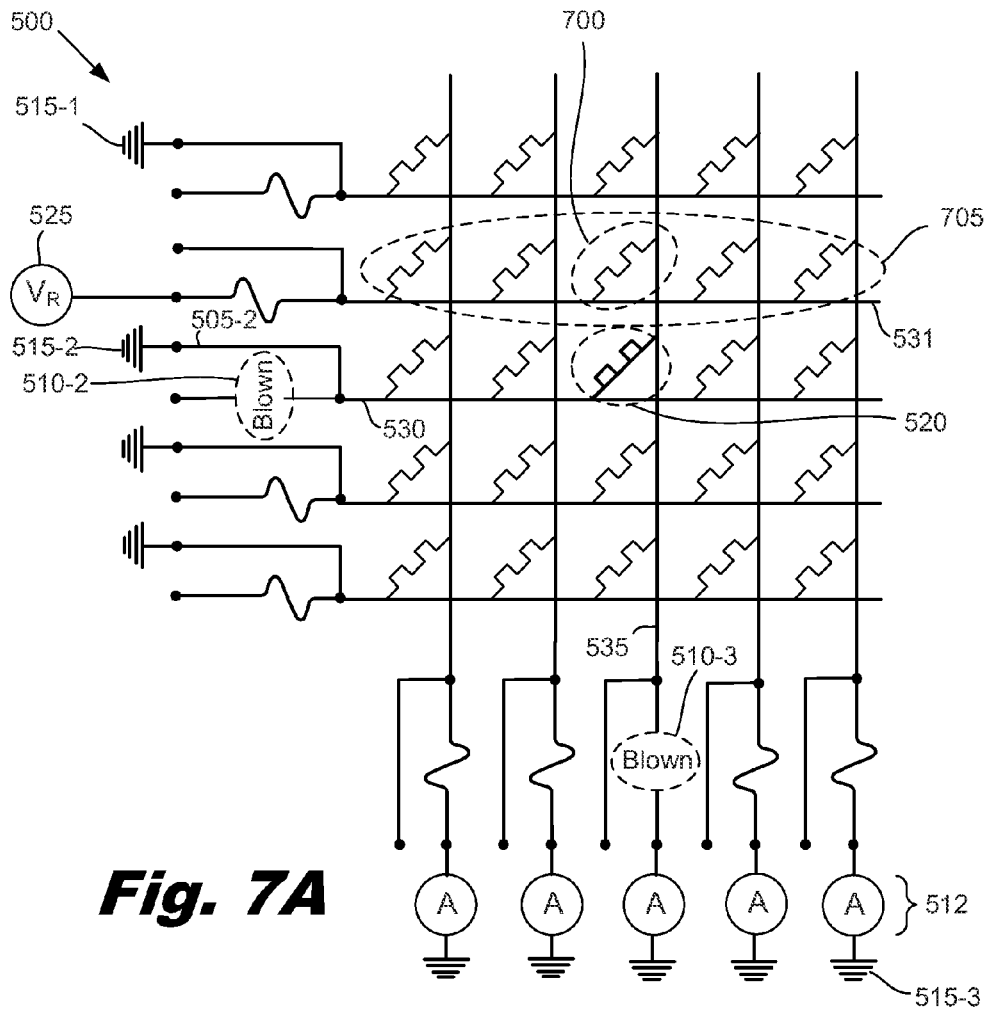
FIG. 7A is a diagram of a programmable crossbar array with a read voltage applied, according to one example of principles described herein.

FIG. 7A shows the programmable crossbar array (500) in a read configuration where a read voltage (525) is applied along the second row line (531) from the top of the array. Current sensors (512) are connected to all of the column lines. The target memristors (705) are connected to the selected row and see a read voltage on their row terminal and a ground on their column terminal. The first, second, fourth and fifth memristors are connected to ground (515) through the current sensors (512). These current sensors (512) detect the amount of current passing through the memristors to determine their state. The third memristor (700) is on the same column (535) as the shorted memristor (520). As discussed above, the fuses (510-2, 510-3) in the row (530) and column lines (535) connected to the shorted memristor (520) have been blown. However, the row line (530) connected to the shorted memristor is connected to ground (515-2) via the additional connection line (505-2). Current that passes through the third memristor (700) is shunted to ground (515-2) through the shorted memristor (520) in the following way: the current produced by the read voltage passes through the third memristor (700) down the column line (535), through the shorted memristor (520), along the row line (530 and through additional line (505-2) to ground (515-2). The electrical resistance of the third memristor (700) limits the amount of this current to levels that are within the design range for the array.

If the sensors were connected to the crossbar side of line (535) there may be some current detected during a read operation. This may lead to ambiguity about whether an element connected to the line has been shorted. However, in this example, the sensors are connected to the external side of the fuses. Because the fuse (510-3) is blown, there will be no current flowing down line (535) to the current sensor (512)

during a read operation. Consequently, no current will be detected in that column, indicating that the column is bad (i.e., contains a shorted device). This allows the bits in this column to be marked as erased.

In the example shown in FIG. 7A there is no question that the fuse has been blown and the bits stored in the column should be marked as erased. If no current is detected when reading all memristors in a row, then it can be assumed that the fuse on the row is blown and the row is unreliable because it contains a shorted device. All the data contained in the row can then be marked as erased for ECC decoding purposes. If no current is detected for all memristors in a column then the column has a blown fuse and a shorted device. Consequently, the whole column is deemed unreliable and can be marked as erased.

The configuration shown in FIG. 7A provides for separate lines to connect the ground and voltage sources/current sensors, with the ground connected to the inner terminal of the fuse and the voltage or sensor connected to the outer terminal. This allows for grounding of lines connected to a shorted memristor without affecting currents either induced by the source or sensed by the sensor.

As discussed above, where both the row and column lines have inline fuses, one of the fuses can be configured to blow when a memristor shorts but the other fuse will not blow. In some implementations, the fuses connected to the row lines and the fuses connected to the column lines may not be identical. For example, the fuses connected to the column lines may be designed to blow more quickly and/or at lower energy levels than the fuses connected to the row lines. This ensures that the fuses in the column lines will reliably blow when a memristor shorts during application of a programming voltage. The other fuse may blow at a higher energy or may be a "slow blow" fuse. For example, if the application of read and programming voltages to the array have periods of nanoseconds, the "slow blow" fuse may be configured to blow when voltages are applied over time periods of microseconds.

Figure 7B:
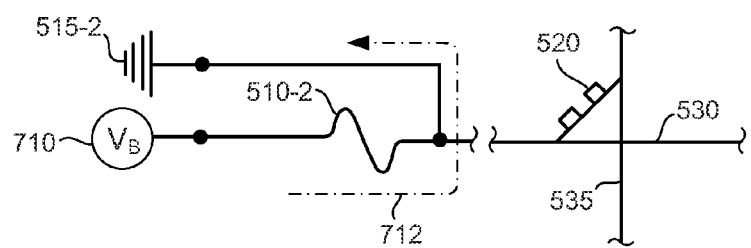
FIG. 7B is a diagram of an applied blow voltage and ground to blow an inline fuse connected to a shorted memristor, according to one example of principles described herein.

A variety of techniques can be used to blow the second fuse after detecting a shorted memristor. FIG. 7B is a diagram of an applied voltage (710) and ground (515-2) to blow an inline fuse (510-2) connected to a shorted memristor (520). In this example, a blow voltage ($V_B$) is connected to the external terminal of the fuse (510-2) and a ground (515-2) is connected to the inside terminal of the fuse. The current (712) generated by this blow voltage passes from the voltage source, through the fuse (510-2) and to the ground (515-2). This blows the fuse (510-2) to mark the row line (530) as having a shorted memristor (520) and prevent damage to the array.

The voltage level and time duration of the blow voltage is configured to blow the fuse (510-2). For example, the blow voltage may have a voltage level that is lower than the programming voltage or the read voltage, but may have a significantly longer duration. In other examples, the blow voltage may be applied as series of voltage pulses that are specifically designed to blow the fuse (510-2). In other examples, the blow voltage may have a magnitude that is the same or greater than the programming or reading voltage. For example, the blow voltage may be produced by the same circuit that generates the programming voltage. However, because the voltage is directly passed to ground through the fuse, the voltage on the row line (530) does not ever reach the read and/or programming voltage levels.

The examples above show crossbar architectures that include fuses inline with all the lines in the array. However, the fuses may be inline with only a portion of the lines. For example, the fuses may be inline with only the row lines or only the column lines. These implementations are simpler than the previous examples. The fuses are designed so that they blow with the current surge caused by the short, with no additional intervention. No special provisions, such as additional lines, are made for grounding.

Figure 8:
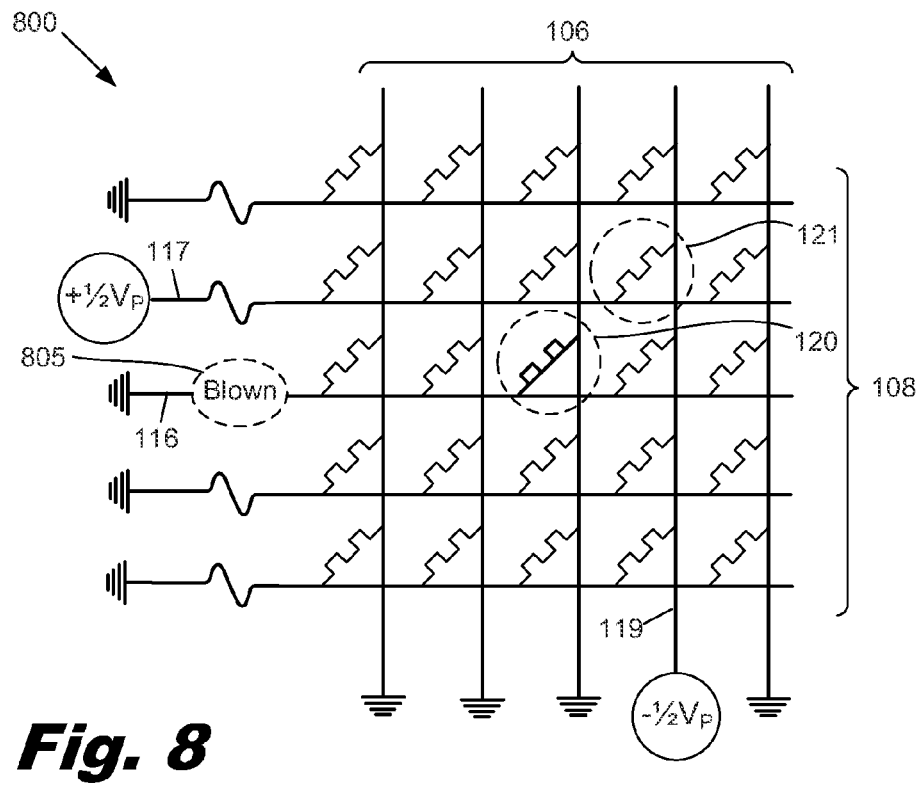
FIG. 8 is a diagram of a programmable crossbar array with inline fuses in the row lines and a programming voltage applied to a selected row line and selected column line, according to one example of principles described herein.
Figure 9:
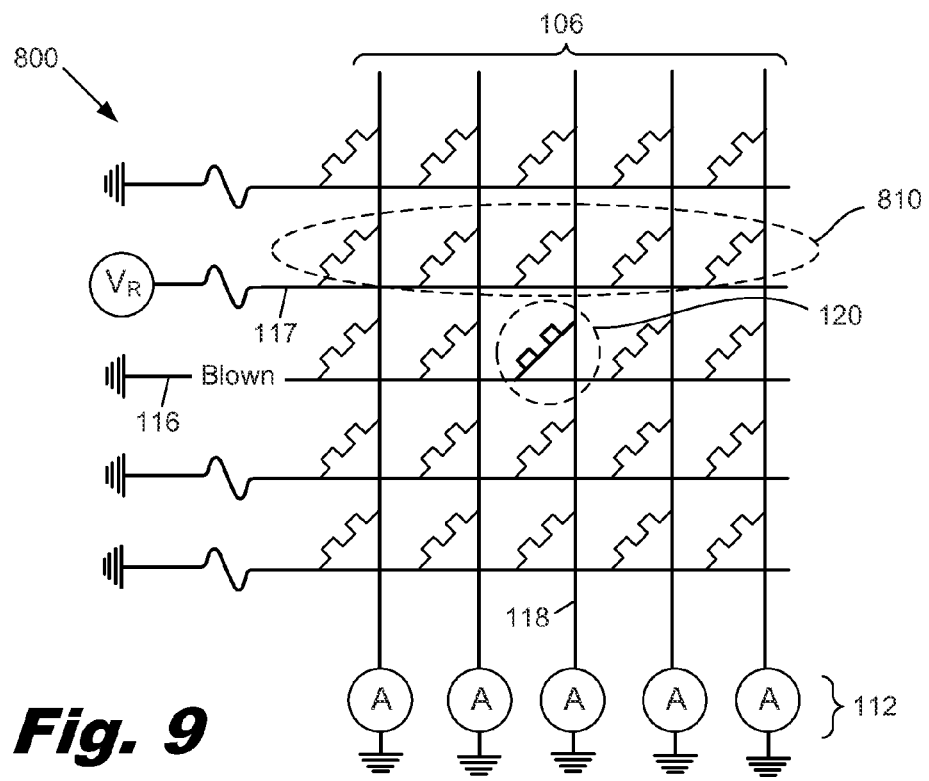
FIG. 9 is a diagram of a programmable crossbar array with inline fuses in the row lines and a read voltage applied to a selected row line and current sensors applied to the column lines, according to one example of principles described herein.

FIGS. 8 and 9 show an example of a programmable crossbar array (800) that only includes fuses in the row lines (108). The column lines (106) are connected directly to the support circuitry without intervening fuses. FIG. 8 includes a shorted memristor (120) that has blown a fuse in the row line (116) that it is connected to. FIG. 8 also shows a programming voltage ($+\frac{1}{2}V_P$, $-\frac{1}{2}V_P$) that is applied along a row line (117) and column line (119) to change the state of a target memristor (121). The blown fuse (805) marks the row of the shorted memristor (120) and prevents application of reading and programming voltages to that row (116). This configuration preserves the avoidance of excessive currents when attempting to write to a shorted location and also the ability to identify shorted rows. However, it does not preserve the ability to identify shorted columns ("erased" columns). Reading from the devices on the same column as the shorted memristor may be unreliable and may have to be handled as "full errors" rather than "erasures" by the ECC system. The system offers a trade-off: a simpler architecture and fuse system at the price of a more powerful ECC.

FIG. 9 shows the array (800) in a read configuration, with the read voltage ($V_R$) connected to a row line (117) so that state of all the memristors (810) connected to that row line can be read by current sensors (112) connected to the column lines (106). In this example, the shorted memristor (120) does not shunt the current passing along the column (118) to ground and the state memristor connected to this column can potentially be read. However, because the example of FIGS. 8 and 9 does not include fuses in both the row lines and the column lines, the exact location of the shorted memristor is not marked by blown fuses. To recover data that was stored in the shorted memristor or in memristors in the same row and column as the shorted memristor, a more robust ECC code may be used.

Figure 10:
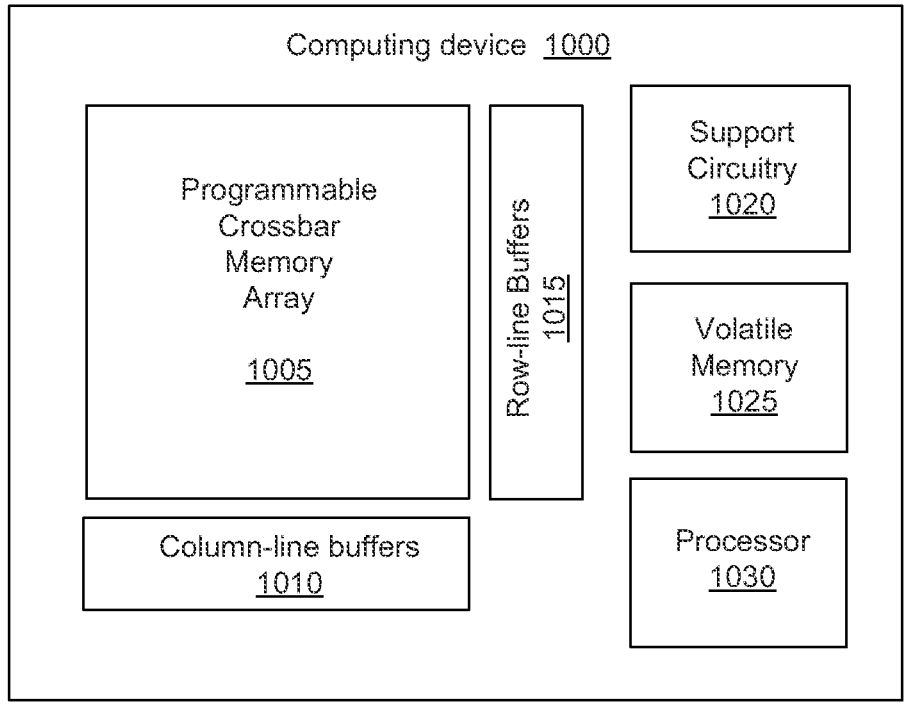
FIG. 10 is a block diagram of a computing system that includes a programmable crossbar array with inline fuses, according to one example of principles described herein.

FIG. 10 is a diagram of a computing device (1000) that includes a programmable crossbar array (1005) with inline fuses. The crossbars in the crossbar array (1005) are connected to column line buffers (1010) and row line buffers (1015). The column line buffers (1010) and row line buffers (1015) are selectively activated to connect support circuitry (1020) to the column lines and row lines in the programmable crossbar array (1005). Thus, the buffers can be viewed as switches that selectively connect and disconnect the various components within the support circuitry to selected lines. The support circuitry (1020) may include voltage supplies, a ground and current sensors. The support circuitry may also include a variety of other circuits including sense circuitry, threshold modules, sample and hold circuits and other circuits that support the function of the crossbar array (1005). The processor (1030) and volatile memory (1025) may read and write data to the nonvolatile memristors in the programmable crossbar array (1005).

In some examples, the support circuitry (1020) may automatically detect shorted memristors and take the appropriate mitigating action. For example, the support circuitry may identify a shorted memristor and blow a fuse in a line connected to the shorted memristor. In other examples, the support circuitry may work cooperatively with the processor (1030) and volatile memory (1025) to detect potential shorted memristors within the crossbar array (805) and take appropriate corrective action. For example, the processor and volatile memory may be programmed to recover data that was stored or intended to be stored on the shorted memristor or on memristors in the same row and column as the shorted memristor.

The description above describes a number of examples of programmable crossbar arrays with inline fuses that include a layer of row lines and a layer of column lines with the row conductors crossing over the column conductors to form junctions and memristors sandwiched between row lines and column lines at the junctions. Inline fuses are placed either in the row lines, column lines or both. The inline fuses are interposed between the support circuitry and the memristors. In some implementations, additional lines may be connected to row and column lines on an array side of the fuses. These additional lines provide grounding paths to prevent lines that are disconnected by blown fuses from undesirably floating at intermediate voltages.

The inline fuses connected to the lines are configured to blow when a memristor connected to the line shorts. In some examples, the inline fuses may automatically blow. In other examples some of the inline fuses may blow automatically while others are blown by a separate application of a voltage. The blown fuses may serve as flags marking shorted memristors for an error correction code decoder to recover data and prevent application of programming and reading voltages to lines connected to the shorted memristors. Buffers may be used to connect/switch various elements in the support circuitry to the lines in the crossbar array. The support circuitry may include voltage sources, current sensors, a ground, and other components.

Figure 11:
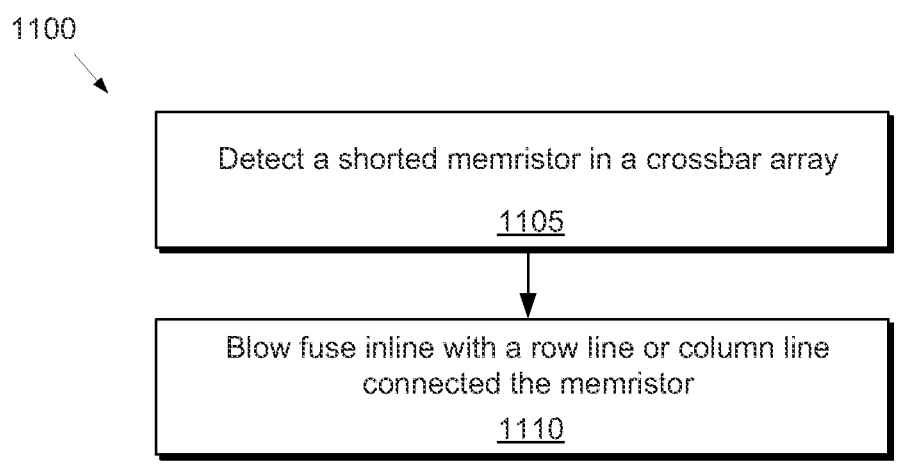
FIG. 11 is a flowchart of a method for using a programmable crossbar array with inline fuses, according to one example of principles described herein.

FIG. 11 is a flowchart (1100) which describes a method for using fuses to mitigate shorted memristors in a programmable crossbar array. As discussed above, the shorted elements have a resistance that is significantly less than the lowest operating resistance. For multilevel cells, a shorted element has a lower resistance than the lowest designed resistance of the multilevel cell or a higher current than the maximum expected current.

The method includes detecting a shorted memristor within the array (1105). The shorted memristor may be detected in a number of ways. The occurrence of a short will likely be detected when an attempt to write into a memristor results in current exceeding some pre-established threshold. The shorting of a memristor could automatically result in the blowing of a fuse connected to the row or column line connected to the shorted element. The blowing of the fuse could also be detected by a lack of current flowing through the circuit.

In other examples, the shorting of the memristor may exhibit a unique electrical signature that could be detected. Other techniques include measuring the electrical resistance of the shorted memristor and determining that it is lower than the lowest design resistance of the memristors in the array. For example, when applying a reading voltage to the shorted memristor(s), an abnormally high current may flow through the shorted memristor(s).

Other examples including attempting to switch the shorted memristor and determining that the shorted memristor did not respond. For example, a first programming voltage could be applied to switch the memristor from a low resistance ON state to a high resistance OFF state. However, because the memristor is shorted, it will not respond to this or any other programming voltage. After applying the programming voltage, it can be determined that the memristor did not switch to the high resistance OFF state, thus indicating that the memristor may be shorted.

The fuse (or fuses) inline with a row and/or column line connected to the shorted memristor are then blown (1110). For example, at least one of the shorted elements may blow as a result of the current flowing through the line. In some implementations, a second fuse may be blown through a separate process. As discussed above with respect to FIG. 7B, a current sufficient to blow the second fuse can be applied by grounding one side of the fuse and applying a voltage at the second end of the fuse. This blows the fuse in a controlled manner that does not require current to pass through the shorted memristor or any other memristor in the array.

Data stored on the shorted memristor (and memristors that are affected by shorted memristor) may be recovered. The data that was stored, or was intended to be stored, on the shorted memristor can be recovered in a variety of ways. For example, if it is desirable for the data written on the memristor to be recovered, an error correction code can be used. An error correction code is derived from a block of data and is designed to allow a limited number of errors to be corrected. An error correction code can compensate for errors caused by write issues, noise, storage faults, failure of memristors, and other types of errors. As discussed above, in examples where the fuses mark the location of the shorted memristors, the overhead for implementing the error correction code may be significantly smaller.

In other situations, the data to be written to the crossbar array may be most important. This data can be preserved by maintaining the data in a separate memory until it is confirmed that the write to the crossbar array is successful and complete. When failure occurs, the data can simply be rewritten to a different location in the crossbar array.

In some situations, the memristors may disproportionately fail during a write operation because the write operation uses higher voltages than a read operation. Further, the memristors may disproportionately fail during write operations that transition from a high resistance state to a low resistance state. This may occur for a variety of reasons, including the generation of a current spike that occurs as the memristor's electrical resistance rapidly drops during the switching process. Because the typical failure characteristics of the memristors can be characterized in advance, the data bit that was intended to be stored on the shorted memristor can be assumed. For example, if the memristors tend to fail during a write operation from a high resistance OFF state to a low resistance ON state, it can be assumed with a predetermined level of confidence that the shorted memristor should be read as being in the ON state or a digital 1. In some implementations, memristors that are connected to the same row and column as a shorted memristor may not be readable or programmable. However, in other implementations, such as those shown in FIGS. 8 and 9, at least a portion of the memristors may be readable.

In future write operations, the failure of the shorted memristor can be compensated for when writing the data to the crossbar array by skipping the row and column connected to the shorted memristor. Where inline fuses connected to the row and column connected to the shorted memristor are blown, the system cannot write to the row and column because they are electrically disconnected. This effectively flags the location of the shorted memristors and allows the system to automatically compensate.

In conclusion, the principles described above provide for graceful degradation of the programmable crossbar array. One or more inline fuses are blown when a memristor shorts. If an attempt is made to write to the shorted memristor, voltages will be applied to open conductors, so no current will flow. This prevents excessive currents that may damage the array, support circuits, and produce other undesirable effects. When attempting to read from any location in the affected row or column, again no current will flow. This situation is easily and reliably detected so that the affected row and column can be marked as "erased" which is a computationally easier problem for ECC data recovery.

When coupled with an appropriate ECC scheme, the principles above make the handling of shorted locations "transparent" to the system, in the sense that the addressing mechanisms are identical whether the row or column addressed contain defective devices or not. All the knowledge about the defects is contained, overall, in the array of fuses, which act, in a sense, as "flags" marking defective locations. When reading the array, these locations will produce distinctive readings which can be interpreted by the ECC system to handle the errors efficiently. In a sense, the array of fuses acts as the "defect list" mentioned earlier, except that the fuse "list" is distributed and local, and does not require any handling or processing, except at the instant a short occurs, when the appropriate fuses are blown.

By mitigating the shorting of a memristor, the function and a substantial portion of the capacity of the programmable crossbar array are preserved. The use of inline fuses can reduce power consumption, allow for transparent operation, allow for more efficient recovery of data lost due to memristor failure, protect the array and support circuitry from current surges, and provide other benefits. Although examples above refer to "memristors," any a wide range of nonvolatile resistive memory elements could be substituted for the memristors in the crossbar array.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A programmable crossbar array with inline fuses comprising:
   a layer of row lines;
   a layer of column lines, the row lines crossing over the column lines to Form junctions;
   resistive memory elements sandwiched between row lines and column lines at the junctions;
   support circuitry; and
   inline fuses in either the row lines, column lines or both, the inline fuses interposed between the support circuitry and the resistive memory elements.

2. The array of claim 1, in which inline fuses are connected inline with only one of: the row lines and the column lines.

3. The array of claim 1, in which the inline fuses are connected inline in both the row lines and the column lines.

4. The array of claim 1, further comprising a separate line connected to the row and column lines on an inner terminal of fuses in the row and column lines, such that when a resistive memory element shorts, a ground is connected to the inner terminal of the fuse via the separate line.

5. The array of claim 1, in which an inline fuse connected to a line is caused to blow when a resistive memory element connected to the line shorts, in which the blown fuse serves as:
   a flag marking shorted resistive memory elements for error correction code to recover data stored in a shorted resistive memory element and in resistive memory elements in the same row and column as the shorted resistive memory element; and
   to prevent application of programming and reading voltages to the line connected to the shorted resistive memory element.

6. The array of claim 1, in which the support circuitry comprises a voltage source, a current sensor, and a ground.

7. The array of claim 6, further comprising a switch for switching row and column connections between different support circuitry components.

8. The array of claim 6, further comprising an array read configuration in which the voltage source is applied to a selected row line with a remainder of the row lines connected to ground and the current sensors are connected to all of the column lines, in which a voltage applied to the selected row line creates currents passing through resistive devices connected to the row line, the currents passing down the column lines to be sensed by the current sensors.

9. The array of claim 6, further comprising an array write configuration comprising a portion of a programming voltage applied to a selected row line and a portion of the programming voltage is applied to a selected column line, in which a complete programming voltage is applied across a target device interposed between the selected row line and selected column line.

10. A method comprising:
    detecting a shorted memristor in a crossbar array, in which the shorted Memristor is connected to a row line and column line; and
    blowing a fuse inline with one of the row line or the column line.

11. The method of claim 10, further comprising recovering data stored in the shorted memristor by identifying the location of the shorted memristor using the blown fuse.

12. The method of claim 11, in which recovering data stored in the shorted memristor comprises:
    using an error correction code to recover data stored in the shorted memristor and other memristors in the same row and column as the shorted memristor; and
    copying the recovered data to a non-defective memory location.

13. The method of claim 10, further comprising writing the data to the crossbar array by skipping write operations on the row and column connected to the shorted memristor.

14. The method of claim 10, in which detecting a shorted memristor comprises a current surge through the shorted memristor that passes down a line and blows the fuse.

15. The method of claim 10, further comprising
    executing a read operation by applying a read voltage to the crossbar array and connecting current sensors to the crossbar array to detect current passing through memristors in the array;
    when no current is detected in a line during the read operation, marking data stored in memristors connected to the line as erased; and
    recovering the data using error correction code.

16. The method of claim 10, in which a first fuse is inline with a first line connected to the shorted memristor and a second fuse is inline with a second line connected to the shorted memristor, the method further comprising:
    blowing the first fuse by passing a current passing through the shorted memristor; and
    blowing the second fuse by a current that does not pass through the shorted memristor.

17. The method of claim 16, in which blowing the second fuse comprises:
    grounding one end of the fuse; and
    applying voltage to the opposite end of the fuse.

18. The method of claim 10, in which detecting the shorted memristor comprises detecting an abnormally low resistance of the shorted memristor.

19. The method of claim 10, in which detecting the shorted memristor comprises detecting an abnormally high current passing through the shorted memristor.

20. The method of claim 10, in which detecting the shorted memristor comprises:
   applying a read voltage to the row line in the crossbar array;
   when current does not flow through a first column line crossing the row line, marking data stored in the first column line as erased;
   when current does not flow through any columns lines crossing the row line, marking the data stored in the row line as erased; and
   recovering the data using error correction code.

* * * * *

UNITED STATES PATENT AND TRADEMARK OFFICE
CERTIFICATE OF CORRECTION

PATENT NO. : 8,917,537 B2  
APPLICATION NO. : 13/754616  
DATED : December 23, 2014  
INVENTOR(S) : Erik Ordentlich et al.

Page 1 of 1

It is certified that error appears in the above-identified patent and that said Letters Patent is hereby corrected as shown below:

In the Claims,

In column 11, line 38, in Claim 1, delete "Form" and insert -- form --, therefor.

In column 12, line 21, in Claim 10, delete "Memristor" and insert -- memristor --, therefor.

Signed and Sealed this  
Eighth Day of September, 2015

Michelle K. Lee  
*Director of the United States Patent and Trademark Office*